(12) United States Patent
Markovich et al.

(10) Patent No.: US 6,788,859 B1
(45) Date of Patent: Sep. 7, 2004

(54) LAMINATE SUBSTRATE CONTAINING FIBER OPTIC CABLES

(75) Inventors: Voya R. Markovich, Endwell, NY (US); Sandeep B. Sane, Chandler, AZ (US); Sanjeev Sathe, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/286,732

(22) Filed: Oct. 31, 2002

(51) Int. Cl.[7] .................................................. G02B 6/44
(52) U.S. Cl. ..................................................... 385/114
(58) Field of Search ........................ 385/14, 15, 89–92, 385/114, 50, 135

(56) References Cited

U.S. PATENT DOCUMENTS

| | | | | |
|---|---|---|---|---|
| 4,221,962 A | * | 9/1980 | Black et al. | |
| 4,998,159 A | * | 3/1991 | Shinohara et al. | |
| 5,006,201 A | * | 4/1991 | Kaukeinen | |
| 5,562,838 A | * | 10/1996 | Wojnarowski et al. | |
| 6,048,107 A | * | 4/2000 | Pubanz | |
| 6,181,854 B1 | * | 1/2001 | Kojima et al. | |
| 6,210,046 B1 | * | 4/2001 | Rogers et al. | |
| 6,233,376 B1 | * | 5/2001 | Updegrove | |
| 6,244,756 B1 | * | 6/2001 | Bloom | |

* cited by examiner

Primary Examiner—Khiem Nguyen
(74) Attorney, Agent, or Firm—Mark Levy; Arthur J. Samodovitz

(57) ABSTRACT

A method and an article made by a method for embedding optical fibers into an organic laminate structure. The optical fiber cabling, along with its cladding, is placed upon a first laminate layer that includes a composite made of silica fillers and a frictionless material such as polytetrafluoroethylene (PTFE). Then a second layer of PTFE material with silica fillers and copper sheeting is placed on top of the PTFE with silica fillers composite. The PTFE material with silica fillers flows about the optical fibers at a temperature approximately fifty degrees above the PTFE with silica fillers material's melting point. This procedure completely encases the optical fibers within an opaque sheath.

16 Claims, 2 Drawing Sheets

LAMINATE SUBSTRATE CONTAINING FIBER OPTIC CABLES

FIELD OF THE INVENTION

The present invention relates to the transmission of optical signals and, more particularly, to a method and article of manufacture pursuant to the method, wherein chips and/or electronic circuit components are fabricated with embedded optical cables for transmitting optical and electrical signals.

BACKGROUND OF THE INVENTION

The need for operating circuits with higher clock speeds and for improving the quality of electrical transmission signals has given rise to the use of optical circuits and methods. The optical transmission of electrical signals offers some distinct advantages over transmitting the signals by electrical wiring, to wit: optical circuits are scalable to higher clock speeds; optical circuits do not suffer from frequency or distance-dependent signal distortion; and optical signals have low dissipation. Most importantly, optical circuits can provide greater bandwidth.

The different components of optical circuitry comprise emitters to convert electrical signals from the chips to optical signals, detectors to convert from optical signals to electrical signals, and mirrors/lenses, waveguides, or fiber optics cables for transmitting the optical signals.

There are two key requirements for successfully implementing optical methods and components into an electrical circuit environment: developing efficient manufacturing techniques for implementing and incorporating the optical components within the electrical circuit in a cost effective manner; and developing ways to densely pack optical components into an array and upon a laminate in order to match or exceed the electrical performance of present day electronic chips.

There are currently two ways to transfer an optical signal: use waveguides (typically made of polyimides or silicon based materials) or utilize fiber optic cables. To incorporate a waveguide into a laminate requires additional fabrication steps that can drastically increase the costs of manufacture.

The present invention involves a low cost method of incorporating fiber optic cables within organic laminates such as ball grid array (BGA) circuit laminate. The optical fibers of this invention are embedded within these organic laminates during the lamination process, so no additional fabrication steps are required. The optical fiber cabling, along with its cladding, is laid down on top of a first laminate layer, comprising a composite of silica fillers and a frictionless material like polytetrafluoroethylene (PTFE). Then a second layer of PTFE material with silica fillers and copper sheeting are placed on top of the PTFE with silica fillers composite. The PTFE material with silica fillers is flowable about the optical fibers, thus completely encasing them within an opaque sheath. This provides good optical isolation.

The laminate is then subjected to a laminating heat cycle, whose maximum temperature between approximately 350° C. and 400° C. is approximately fifty degrees above the PTFE with silica filler material's melting point. The maximum pressure applied is between approximately 1,500 and 2,000 psi. The process completely embeds the optical fibers within the laminate, surrounded by the PTFE material with silica fillers. These optical fibers can then be used for optical signal transmissions within the laminate and the chip. The optical fibers are kept taut during the laminating procedure to provide accurate optical alignment. The laminate can also include electrical, in one example copper, lines for carrying electrical as well as optical signals.

The main advantages of this procedure and the article made therefrom are: optical fiber cables are commercially available in different sizes and there is no significant change in the lamination procedure for the BGA laminate by incorporating these optical fibers. Therefore, the resultant product is cost effective. Contrasting the above method of cable embedding with that of waveguide embedding, it is observed that embedding waveguides requires a significant development program and changes in manufacturing procedures. The optical fibers of this inventive article are surrounded with PTFE material with silica fillers, which is opaque. This automatically provides better optical isolation and shielding for the optical fiber signals.

In U.S. Pat. No. 6,244,756, issued to Bloom on Jun. 12, 2001, entitled APPARATUS AND METHOD BONDING OPTICAL FIBER, a fiber optic device is illustrated comprising embedded optical fibers and a deformable metal seal.

In U.S. Pat. No. 6,233,376, issued to Updegrove on May 15, 2001, entitled EMBEDDED FIBER OPTIC CIRCUIT BOARDS AND INTEGRATED CIRCUITS, a circuit board is illustrated in which optical fibers are embedded in at least one layer of the composite laminate. That circuit board is structurally different from the invention, which provides greater optical alignment accuracy during the embedding and laminating procedure, and in which the fibers are surrounded by an opaque layer of PTFE material with silica fillers that optically isolates the fibers.

In U.S. Pat. No. 6,210,046, issued on Apr. 3, 2001 to Rogers et al for FIBER OPTIC CONNECTOR WITH MICROALIGNABLE LENS HAVING AUTOFOCUS FEATURE AND ASSOCIATED FABRICATION METHOD, a fiber optic connector and method of making same are described. The optical connector features a lens and fiber combination.

In U.S. Pat. No. 6,181,854, issued to Kojima et al on Jan. 30, 2001, entitled OPTICAL MODULE PACKAGED WITH MOLDED RESIN, an optical fiber is contained within a housing, comprising two halves adhesively bonded together.

In U.S. Pat. No. 6,048,107, issued on Apr. 11, 2000 to Pubanz, for CRYOGENIC OPTICAL/ELECTRICAL INTERCONNECT MODULE, a cryogenic module containing optical fibers is illustrated. The optical fibers are adhesively bonded into a V-groove of a connector.

In U.S. Pat. No. 5,562,838, issued to Wojnarowski et al on Oct. 8, 1996, entitled OPTICAL LIGHT PIPE AND MICROWAVE WAVEGUIDE INTERCONNECTS IN MULTICHIP MODULES FORMED USING ADAPTIVE LITHOGRAPHY, an optical waveguide structure is formed within a substrate to provide a high-density interconnection.

In U.S. Pat. No. 5,006,201, issued to Kaukeinen on Apr. 19, 1991, for METHOD OF MAKING A FIBER OPTIC ARRAY, a substrate is shown having a plurality of stacked rows of fiber optic cables contained in the substrate by a glass top cemented thereto.

In U.S. Pat. No. 4,998,159, issued to Shinohara et al on Mar. 5, 1991, entitled CERAMIC LAMINATED CIRCUIT SUBSTRATE, a ceramic substrate is masked using fiber-containing green sheets.

In U.S. Pat. No. 4,221,962, issued on Sep. 9, 1980 to Black et al, for FIBER-OPTIC MOISTURE SENSOR FOR COMPOSITE STRUCTURES, an optical glass fiber is shown embedded in a laminated composite panel.

In Japanese Publication No. 6034827, applied for by Naohisa and published on Feb. 10, 1994, a fiber optic feed-through structure is illustrated.

In Japanese Publication No. 5072134, applied for by Akira et al and published on Mar. 23, 1993, an optical waveguide biosensor system is illustrated.

OBJECTS AND SUMMARY OF THE INVENTION

It is an object of the present invention to provide a fabrication method and an article fabricated by the method, for an organic laminate with embedded optical fibers.

It is another object of the invention to provide an improved BGA laminate containing embedded optical fibers.

In accordance with one embodiment of the invention, there is provided an organic laminate structure for use in an optical-electronic component comprising a core, and a plurality of optically isolated, optic fiber cables disposed adjacent the core and sheathed in an opaque material comprising silica fillers and a frictionless material such as polytetrafluoroethylene (PTFE), the optically isolated optic fiber cables being embedded within the organic laminate structure.

In accordance with another embodiment of the invention, there is provided an organic laminate structure for use in an optical-electronic component comprising a core, and a plurality of optically isolated, optic fiber cables disposed adjacent the core and sheathed in an opaque material, the optically isolated, optic fiber cables being embedded in tension alignment within the organic laminate structure.

In accordance with yet another embodiment of the invention, there is provided a method of fabricating a laminate structure, comprising the steps of disposing a plurality of optical fibers within a laminate structure during a laminating procedure that comprises applying pressure and heat, flowing opaque, optically isolating sheathing material about the optical fibers during the laminating procedure, and maintaining the optical fibers in tension during the laminating procedure.

BRIEF DESCRIPTION OF THE DRAWINGS

A complete understanding of the present invention may be obtained by reference to the accompanying drawings, when considered in conjunction with the subsequent detailed description, in which.

For purposes of brevity and clarity, like components and elements of the apparatus of this invention will bear the same designations or numbering throughout the figures.

BEST MODE FOR CARRYING OUT THE INVENTION

Generally speaking, the invention features a method and an article made by the method for embedding optical fibers into an organic laminate structure. The optical fiber cabling, along with its cladding, is placed upon a first laminate layer, comprising a composite of silica fillers and a frictionless material such as PTFE. Then a second layer of PTFE material with silica fillers and copper sheeting is placed on top of the first composite. The PTFE material with silica fillers flows about the optical fibers at the laminating temperature of approximately 350° C. and 400° C., which is approximately fifty degrees above the PTFE with silica fillers material's melting point. This procedure completely encases the optical fibers within an opaque sheath.

Figure 1:
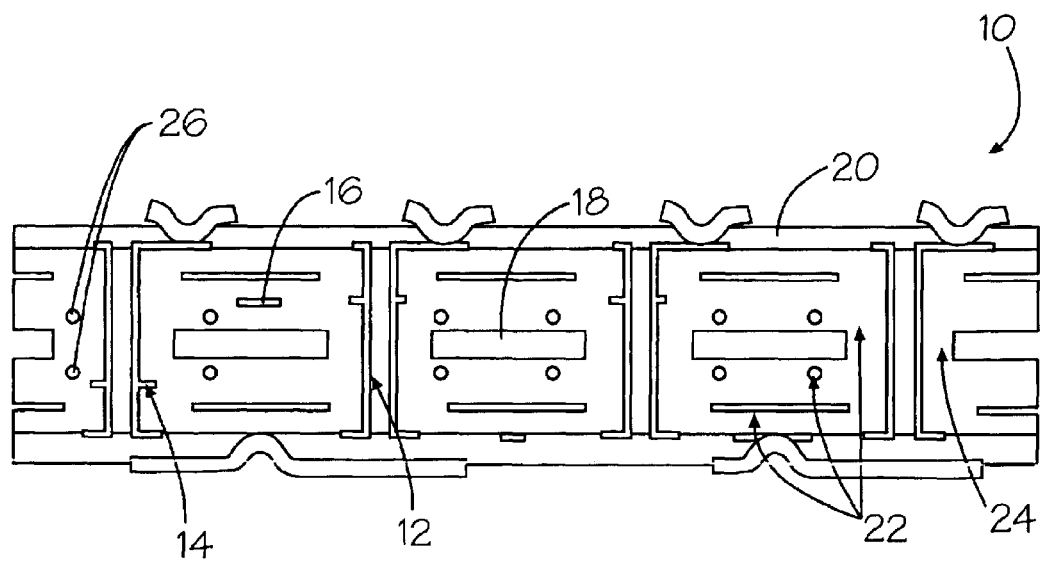
FIG. 1 illustrates a cross-sectional view of a BGA laminate with optical fibers embedded therein.

Now referring to FIG. 1, a cross-sectional view of a BGA laminate 10 is illustrated. The BGA laminate 10 comprises plated through holes (PTHs) 12, a signal pad 14, a signal line 16, a ground plane 18, a power layer 20, dielectric layers 22, and a Copper-Invar-Copper (CIC) core 24. The fiber optic cables 26 are shown embedded within the BGA laminate 10. The optical cable fibers 26 are embedded into the BGA laminate 10 during the laminating process, illustrated in FIG. 2.

Figure 2:
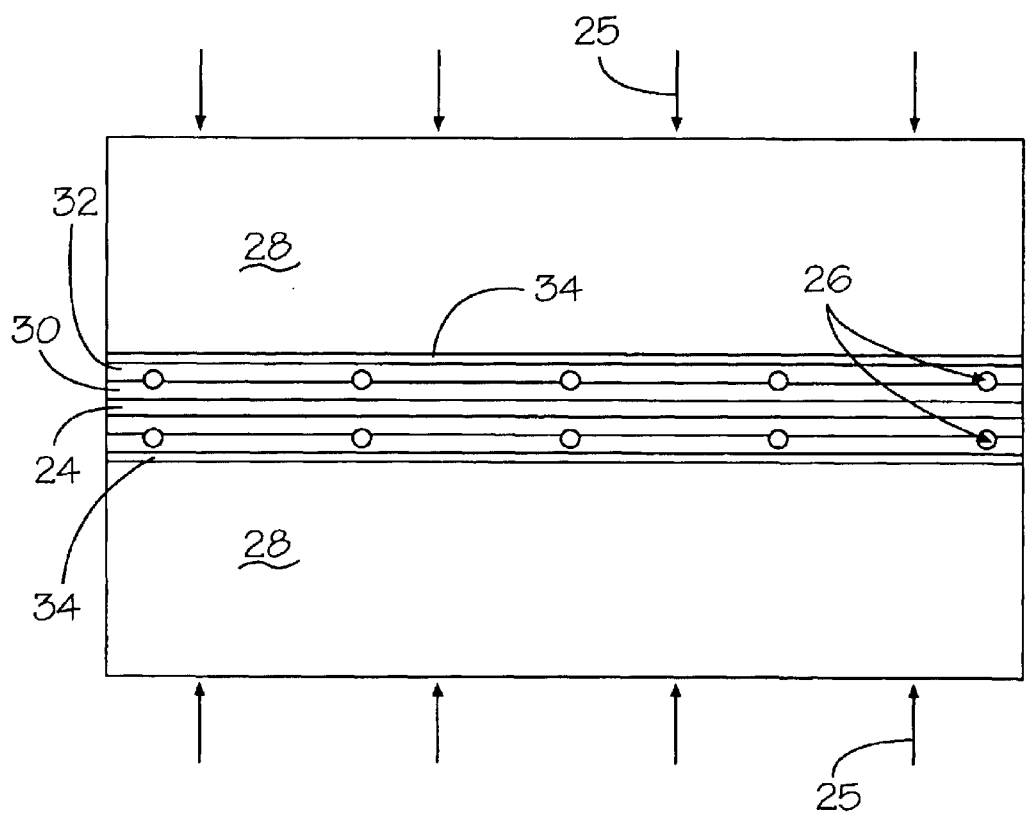
FIG. 2 depicts a schematic, cross-sectional view of a laminating apparatus used to embed the optical fibers into the BGA laminate shown in FIG. 1.

Referring to FIG. 2, a pair of invar planishing plates 28 are shown applying between approximately 1,500 and 2,000 psi pressure (arrows 25) at a maximum laminating temperature of between approximately 350° C. to 400° C., to the CIC core 24 sandwiched between a first PTFE with silica fillers layer 30 and a second PTFE with silica fillers layer 32 and copper sheets 34. The optical fiber cabling 26, along with its cladding, is placed upon first layer 30. The PTFE material with silica fillers flows about the optical fibers 26 at the approximate laminating temperature of between 350° C. to 400° C. This encases the optical fibers within an opaque sheath and provides good optical isolation.

Figure 3:
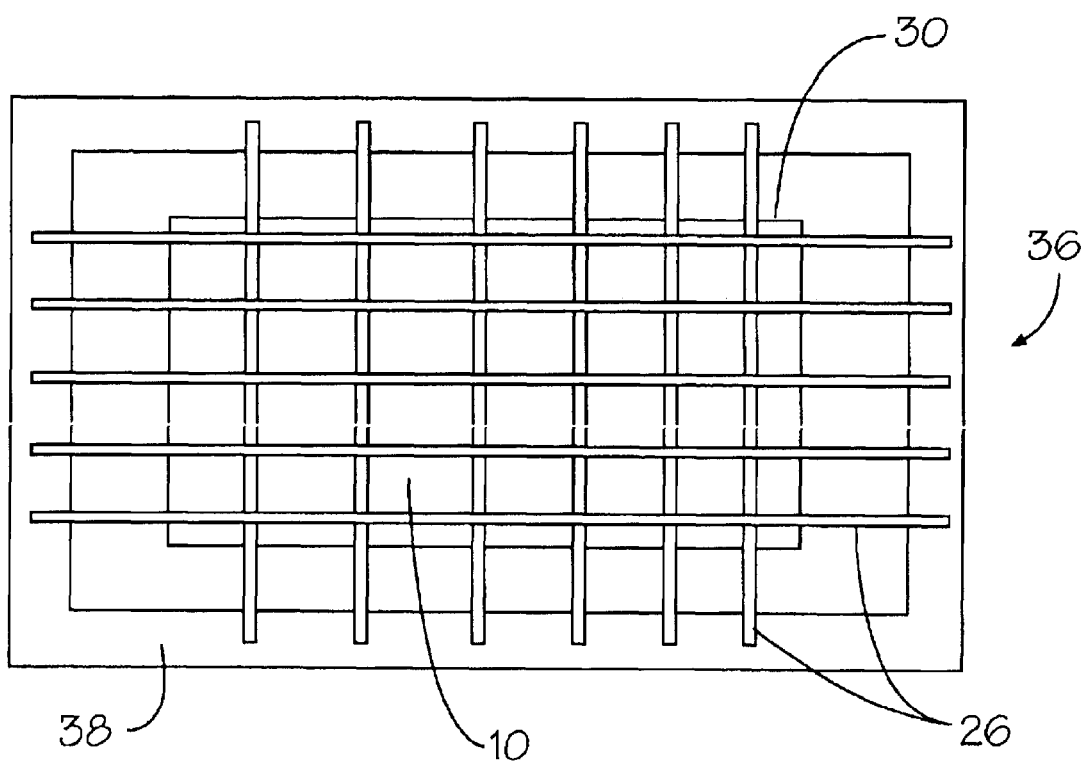
FIG. 3 shows a top view of a fixture for placing the optical fibers in tension during the laminating process illustrated in FIG. 2.

Referring to FIG. 3, a top view of a fixture 36 is shown for keeping the optical fibers 26 taut during the laminating procedure depicted in FIG. 2. The fixture 36 comprises a ring 38 that applies tension to the optical fibers 26 as they are placed on the laminating layer 30 of the BGA 10 laminate.

Since other modifications and changes varied to fit particular operating requirements and environments will be apparent to those skilled in the art, the invention is not considered limited to the example chosen for purposes of disclosure, and covers all changes and modifications that do not constitute departures from the true spirit and scope of this invention.

Having thus described the invention, what is desired to be protected by Letters Patent is presented in the subsequently appended claims.

What is claimed is:

1. An organic BGA laminate structure for use in an optical-electronic component, comprising:
   a core; and
   a plurality of optically isolated, optic fiber cables disposed adjacent said core and sheathed in an opaque material comprising silica fillers and a frictionless material such as polytetrafluoroethylene (PTFE), said optically isolated optic fiber cables being embedded within said organic laminate structure.

2. The organic laminate structure in accordance with claim 1, wherein said plurality of optically isolated, optic fiber cables are taut within said laminate structure.

3. An organic BGA laminate structure for use in an optical-electronic component, comprising:
   a core; and
   a plurality of optically isolated, optic fiber cables disposed adjacent said core and sheathed in an opaque material, said optically isolated, optic fiber cables being embedded in tension alignment within said organic laminate structure.

4. A method of fabricating a BGA laminate structure, comprising the steps of:

disposing a plurality of optical fibers within a laminate structure during a laminating procedure that comprises applying pressure and heat;

flowing opaque, optically isolating sheathing material about said optical fibers during said laminating procedure; and maintaining said optical fibers in tension during said laminating procedure.

5. The method of fabricating a laminate structure in accordance with claim 4, wherein the applied pressure is between approximately 1,500 and 2,000 psi.

6. The method of fabricating a laminate structure in accordance with claim 4, wherein the applied heat is at a temperature of between approximately 350 and 400° C.

7. The method of fabricating a laminate structure in accordance with claim 4, wherein the applied pressure is provided by a pair of planishing plates.

8. A laminate structure fabricated in accordance with the method of claim 4.

9. The laminate structure of claim 8, comprising an organic laminate structure.

10. A method for forming a optical fiber-containing layer in a multi-layer, BGA laminate, the steps comprising:

a) providing a first laminate layer comprising a composite of silica filler and a frictionless material;

b) placing at least one optical fiber thereupon;

c) placing a second laminate layer comprising a composite of silica filler and a frictionless material over said at least one optical fiber;

d) applying pressure to an upper and a lower outside surface of said first and said second laminate layers sandwiching said at least one optical fiber; and e) while performing said applying pressure step (d), heating said first and said second laminate layers sandwiching said at least one optical fiber to a temperature at which said frictionless material flows around said at least one optical fiber, thereby substantially completely enclosing said at least one optical fiber in an opaque sheath.

11. The method for forming a optical fiber-containing layer in a multi-layer, BGA laminate as recited in claim 10, wherein said frictionless material comprises polytetrafluoroethylene (PTFE).

12. The method for forming a optical fiber-containing layer in a multi-layer, BGA laminate as recited in claim 11, wherein said temperature is in the range of approximately 350° C. to 400° C.

13. The method for forming a optical fiber-containing layer in a multi-layer, BGA laminate as recited in claim 12, wherein said applied pressure is in the range of between approximately 1,500 and 2,000 psi.

14. The method for forming a optical fiber-containing layer in a multi-layer, BGA laminate as recited in claim 11, wherein an additional component comprising at least one the components: an additional group of said first and said second laminate layers sandwiching said at least one optical fiber, an insulating layer, an electrically conductive layer, and a dielectric layer are stacked vertically with said first and said second laminate layers sandwiching said at least one optical fiber prior to performing said applying pressure step (d) and said heating step (e).

15. The method for forming a optical fiber-containing layer in a multi-layer, BGA laminate as recited in claim 10, wherein said at least one optical fiber comprises a plurality of optical fibers disposed substantially parallel to one another.

16. The method for forming a optical fiber-containing layer in a multi-layer, BGA laminate as recited in claim 14, the steps further comprising:

f) applying tension to said at least one optical fiber prior to performing said applying pressure step (d) and said heating step (e).

* * * * *